United States Patent [19]

Dye et al.

[11] 4,169,213
[45] Sep. 25, 1979

[54] APPARATUS AND METHOD FOR ORDERING INDEPENDENT SIGNALS

[75] Inventors: Richard A. Dye; Robert J. Cinzori; Mark E. Preiser, all of Santa Barbara, Calif.

[73] Assignee: Santa Barbara Research Center, Santa Barbara, Calif.

[21] Appl. No.: 911,568

[22] Filed: Jun. 1, 1978

[51] Int. Cl.² .............................................. G11B 5/02
[52] U.S. Cl. ........................... 179/15 BA; 179/15 BS; 179/15 AW
[58] Field of Search .......... 179/15 AW, 15 A, 15 BS, 179/15 BC; 340/147, 183

[56] References Cited

U.S. PATENT DOCUMENTS

| | | | |
|---|---|---|---|
| 3,158,691 | 11/1964 | Brightman | 179/15 AW |
| 4,051,539 | 9/1977 | Geddes et al. | 179/15 AW |

Primary Examiner—Felix D. Gruber
Assistant Examiner—E. S. Kemeny
Attorney, Agent, or Firm—Elliott N. Kramsky; W. H. MacAllister

[57] ABSTRACT

A method of and apparatus for modulating, demodulating, and ordering independent signals transmitted over a single link provides mux-demux capability by asymmetric average interpulse spacing so that the information will be received only by the proper listening station despite interruptions or errors in transmission. In the two signal embodiment, a master oscillator provides an asymmetric carrier pulse train to a pair of ramp generators, one leading pulse edge triggered and the other trailing edge triggered. The ramps pulse position modulate the signals by means of a pair of comparators. The modulated outputs of the comparators are applied to an OR gate which combines the pulses to provide a time division multiplexed stream of modulated data having an asymmetric average interpulse spacing. The data stream is transmitted over a pulsed data link to a pair of synchronizers, each of which contains a phase-locked loop having a voltage controlled oscillator whose free running pulse repetition frequency is one-half that of the multiplexed stream and whose loop filter high frequency cutoff is considerably below the lowest modulation frequency. A flip-flop correlator compares the average start times of the voltage controlled oscillators of the two phase-locked loops to provide the control signals for a steering network which directs each of the signals to the proper listening station, assuring the independence of the transmissions.

12 Claims, 8 Drawing Figures

APPARATUS AND METHOD FOR ORDERING INDEPENDENT SIGNALS

BACKGROUND OF THE INVENTION

1. Field of the Invention

The present invention relates to means for the transmission and synchronization of multiple-independent signals and in particular to means for maintaining the separation of multiple independent signals transmitted over a single link.

2. Description of the Prior Art

A variety of links, including laser and microwave, may be employed to provide communication between two remote locations transferring data, voice or the like. Information transferred in such a manner is subject to periodic interruptions, the nature of which will depend upon the frequency and physical characteristics of the type of signal propagation employed. For example, infrared laser transmissions may be interrupted by the passing of an opaque object (such as a bird) through the line of sight of laser transmitter and receiver. Transmissions of multiple time division multiplexed conversations over such a link encounter the problem of commencing and maintaining the proper ordering of the information at the receiver so that the transmissions may remain private and secure rather than intermingled. The maintenance of privacy is complicated by the inherent loss of synchronization which takes place when any multiplexed transmission is interrupted as above described.

Systems have been devised to maintain signal ordering. A duplex two-signal modulation scheme for microwave is mentioned in a paper by Goldberg and Bath ("Multiplex Employing Pulse-Time and Pulse Frequency Modulation", Proc. IRE, January 1949, at p. 22). This system uses modulation of carrier phase for one of the channels, a technique unavailable for use in solid-state pulsed lasers such as the gallium arsenide laser. Another system is mentioned in an article by Rochelle ("Pulse-Frequency Modulation", IRE Trans. on Space, Electronics and Telemetry, June 1962, at p. 107). The described system multiplexes several channels onto a single carrier, each distinguishable from the other by representation in the form of a baseband pulse series utilizing different repetition frequencies. Again, this method of multi-channel modulation is not suited to a pulsed carrier link due to the large amount of energy wasted in the pulse series. A number of other concepts are similar to this system, such as the addition of a channel preamble or a header frame of identifiable width to the multiplexed information. These systems utilize energy and bandwidth without increasing the information content of the transmission.

SUMMARY AND OBJECTS OF THE INVENTION

It is therefore a primary object of the present invention to provide a method and apparatus for maintaining the order of independent signals at a receiver which does not utilize transmission energy or bandwidth for the purpose of signal identification but rather utilizes such energy and bandwidth solely for the transmission of information.

A more specific object of the present invention is to provide a pulsed communicator which automatically orders independent signals carried by a single multiplexed transmission link despite interruptions in transmission to maintain the privacy of said signals at one receiver.

Yet another specific object of the present invention is to maintain the ordering of independent signals at the receiver of a pulsed communicator economically and without increasing the pulse repetition frequency of the communicator.

These and other objects are achieved by the present invention which provides a method and apparatus for accepting and transforming independent signals into a single time division multiplexed stream of pulse position modulated data bits. The stream contains no special codes or headers while being characterized by an asymmetric average interpulse spacing. The multiplexed stream is then transmitted and received in any of a number of pulsed transmission modes including but not limited to radio frequency, microwave, laser, etc. The received transmission is then demodulated into streams of independent information by synchronizers. A steering network automatically directs the information within each synchronizer to the proper output means so that the signals remain properly ordered at the receiver.

In a more specific aspect the present invention includes a pair of synchronizers within the receiver, each of which includes a phase-locked loop whose voltage controlled oscillator runs at a free running frequency of one-half that of the multiplexed transmission. A delay circuit and an inverter enable the two phase-locked loops to turn on a pair of gates alternately and in a synchronized manner so that each synchronizer processes only one signal.

As a further specific aspect of the present invention, the loop filter of each phase-locked loop has a high frequency cutoff below that of the modulation frequency of the information within either synchronizer so that the pulse position modulated data is effectively demodulated by the loop's phase comparator. This allows the steering network to direct demodulated information to each receiver output means.

BRIEF DESCRIPTION OF THE DRAWINGS

Other objects and advantages will become apparent as the following description proceeds, taken in conjunction with the following drawings in which.

While the invention has been shown and will be described in some detail with reference to a preferred embodiment thereof, there is no intention that it thus be limited to such detail. On the contrary, it is intended here to cover all modifications, alternatives, and equivalents falling within the spirit and scope of the invention as defined by the appended claims.

DESCRIPTION OF THE PREFERRED EMBODIMENT

Figure 1:
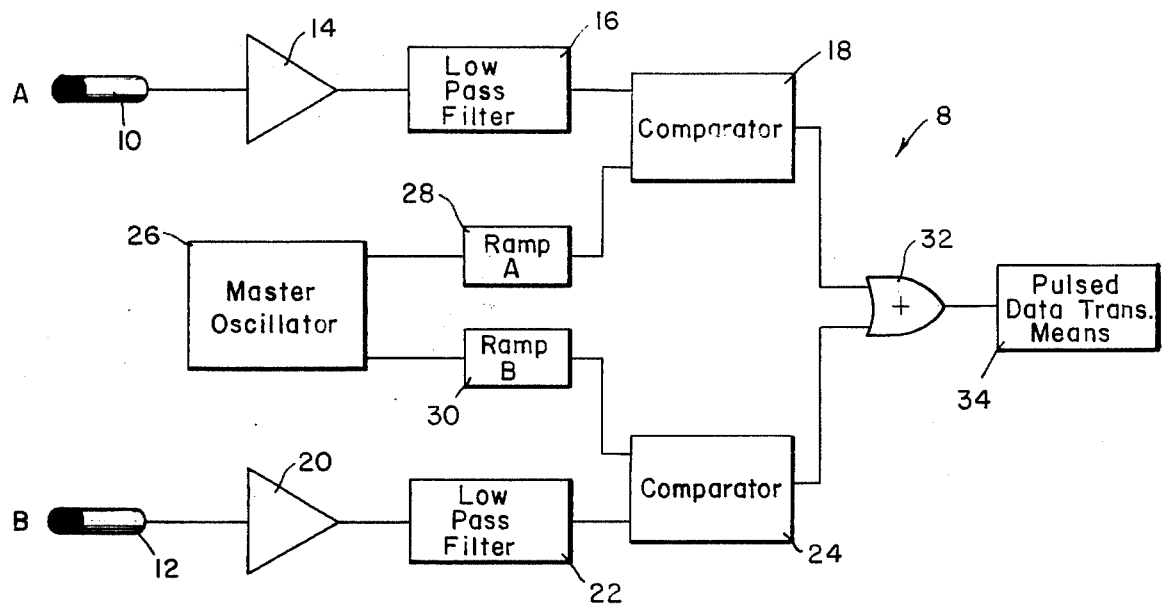
FIG. 1 is a block diagram of a two-signal transmitter embodying the modulation means of the present invention.

Turning now to the drawings, there is shown in FIG. 1 a block diagram of a two-signal transmitter-modulator 8 according to the present invention. For purposes of illustration, the invention as illustrated is utilized to transmit independent voice data, that of signal "A" and signal "B". It is to be understood, however, that the system might also be employed to transmit other familiar modes of information in a manner which similarly achieves the advantages and features of the invention. Additionally, the discussion will proceed with reference to the two-signal version of the invention. However, it is to be understood that such discussion is phrased in terms of a two-signal system merely for ease in illustration thereof. Those skilled in the art will readily appreciate that the disclosed system may be extended to achieve the described advantages for any number of signals.

The two independent transmissions, that of signal "A" and that of signal "B", enter the transmitter-modulator 8 through the microphone 10 and the microphone 12, respectively. Standard means such as the audio amplifier 14 and the low pass filter 16 (signal "A") and the audio amplifier 20 and the low pass filter 22 (signal "B") condition the voice inputs to produce corresponding analog voltage waveforms. The analog signals are then applied to a terminal of the voltage comparator 18 (signal "A") and the voltage comparator 24 (signal "B").

Figure 3:
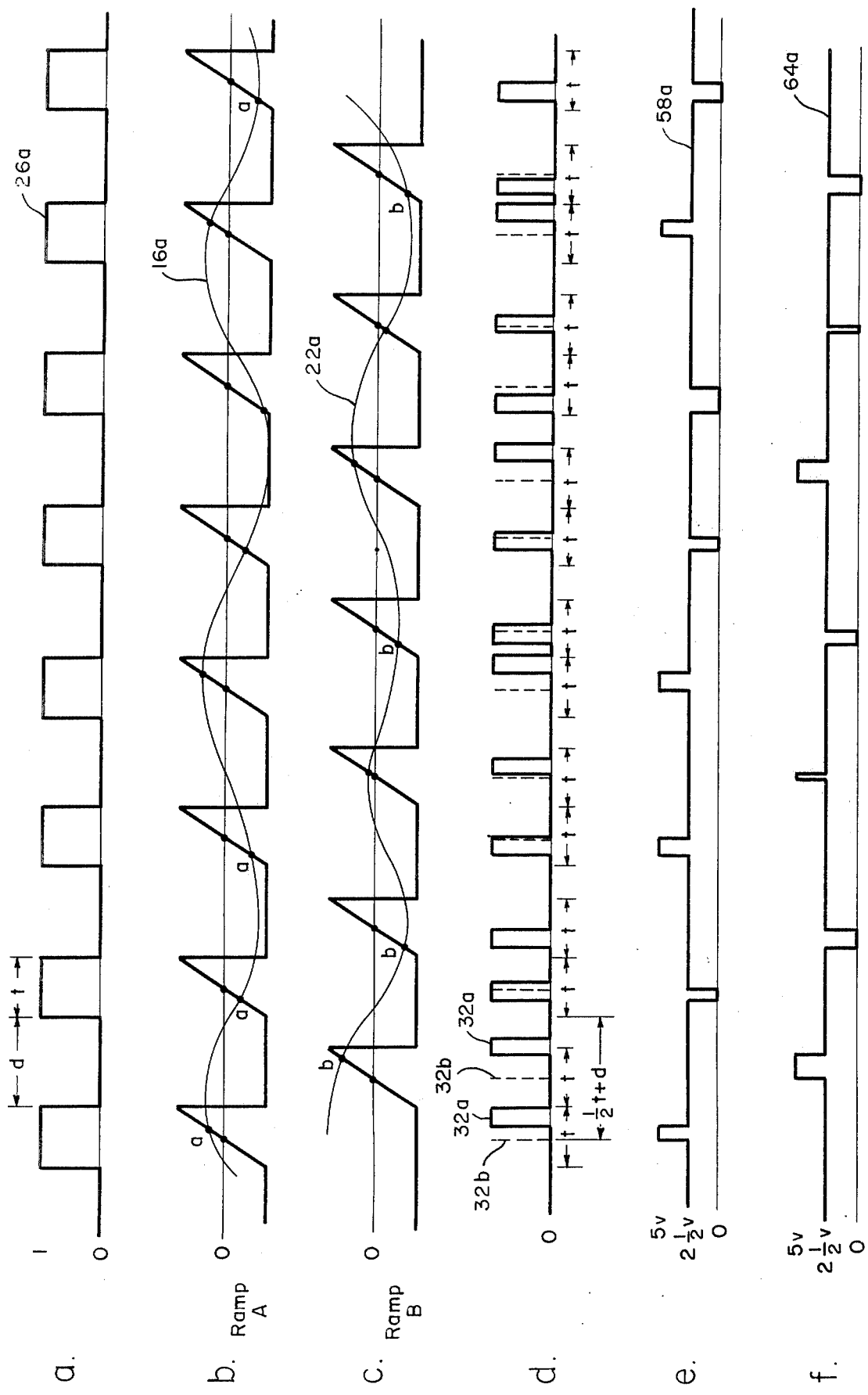
FIGS. 3a–3f are waveforms principally to illustrate the time relationships and widths of pulses, and the method of generation thereof, by the components of the present invention as illustrated in FIGS. 1 and 2.

An asymmetric master oscillator 26 provides the pulsed carrier. The output of the asymmetric master oscillator 26 can be seen in FIG. 3(a) to be a pulse train characterized by an interpulse spacing d, which differs from the pulse width, t. The asymmetric pulse train is applied to the ramp generators 28, 30 simultaneously. The ramp generator 28 is activated by leading edges of the pulses of the master oscillator 26 and the ramp generator 30 is activated by their trailing edges. The ramp generators 28, 30 ramp at equal rates, alternately attaining maxima, then turning off to await the next activating pulse edge. The ramping rate is such that, in conjunction with the triggering asymmetric pulse train 26a of the master oscillator 26, the ramp generators are never "on" simultaneously. To assure this, the ramping time must be no greater than the narrower of the pulse width t and the interpulse spacing d of the pulse train (carrier) output of the asymmetric master oscillator 26. (Although the interpulse spacing d as shown in FIG. 3(a) is greater than the pulse width t, the invention will function with a reversal in the relative sizes.) The ramp height is chosen so that ramp function maximum and minimum (off) values will exceed the corresponding maximum and minimum of the amplitude of the analog voltage signal applied to the comparator 18 and the comparator 24. This provides a crossover point (necessary to trigger a comparator output) during each ramping period.

FIGS. 3(b) and 3(c) illustrate the interaction of the ramp generator 28 and the ramp generator 30 with the (signal "A" and signal "B") analog signals output from the low-pass filter 16 (waveform 16a) and from the low-pass filter 22 (waveform 22a) in the comparator 18 and the comparator 24. Each crossover point (such as a and b) generates a comparator (pulse) output, the position of which is a function (sample) of the amplitude of the analog waveform. As each ramping period generates one sample of the analog waveform (hence its designation hereinafter as a "sampling period"), the frequency of each ramp train from each ramp generator must be at least twice the highest analog voltage frequency being sampled. This corresponds to the Nyquist rate and determines the master oscillator 26 pulse repetition rate. The outputs of the comparator 18 and the comparator 24 are combined in the OR gate 32 to generate the multiplexed pulse train representing the two voice signals. That is, the output of the OR gate 32, shown as the pulse train 32a in FIG. 3(d), is a time division multiplexed stream of the pulse position modulated voice data of the speakers "A" and "B". (The dashed vertical lines 32b in FIG. 3(d) correspond to the zero voltage crossover points of the two analog waveforms and represent the leading edges of the multiplexed pulse train absent modulating signals at either speaker input.)

The output of the OR gate 32 is applied to the pulsed data transmission means 34 for spatial transmission of the modulated data. The pulsed data transmission means 34 may incorporate any of a number of standard methods of conditioning and transmitting information over a data link and will vary according to the transmission frequency and other characteristics desired for a particular application. All means of pulsed data transmission (and encoding thereof), including microwave, laser and rf, are contemplated within the scope of the present invention. A single channel pulse position modulated link incorporating a gallium arsenide laser for the pulsed data transmission is described by W. S. Holden in "Optical-Frequency Pulse-Position Modulation Experiment", Bell System Technical Journal (February 1975). Such a single channel system, of course, does not deal with the multiplexing and demodulation problems solved by the present invention.

Figure 2:
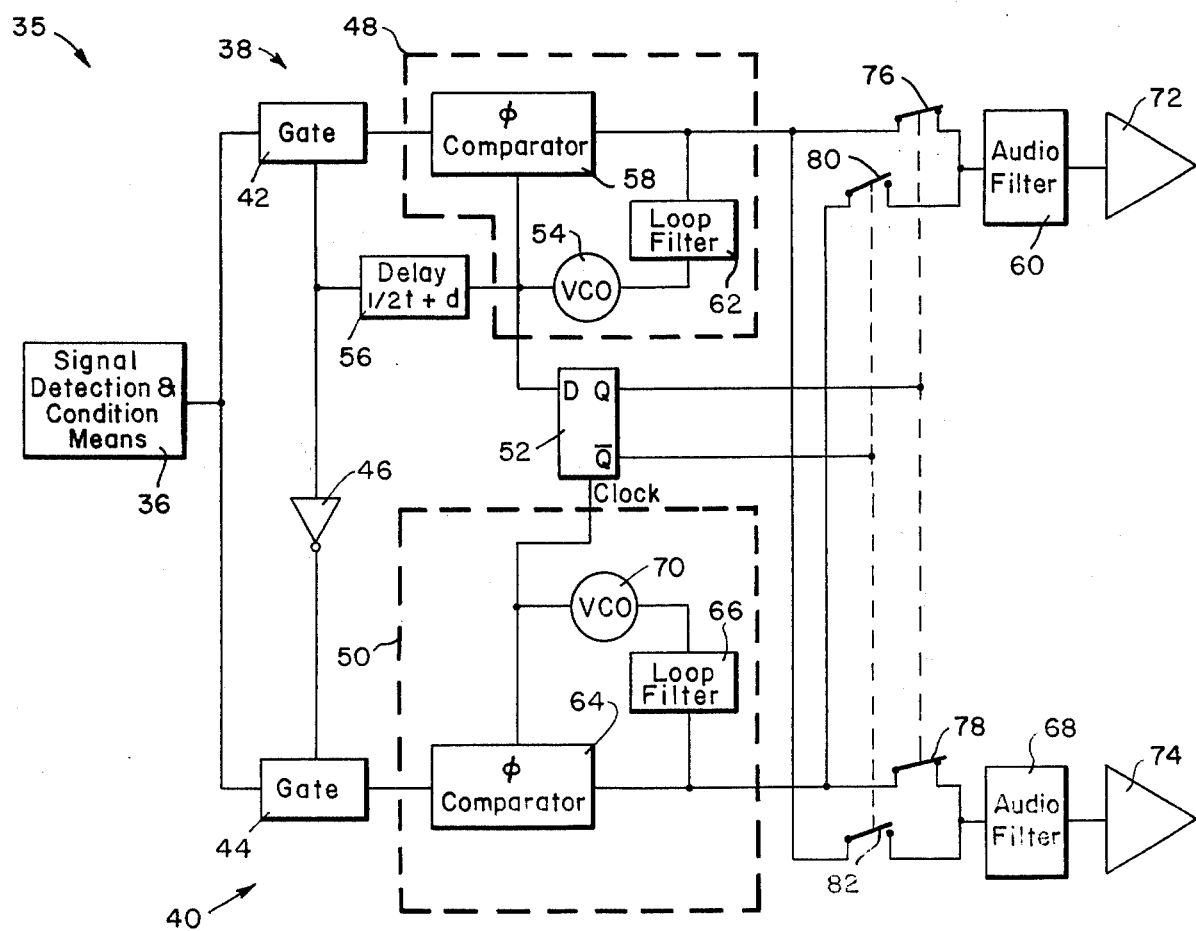
FIG. 2 is a block diagram of a two-signal receiver embodying various aspects of the present invention including but not limited to the synchronizers and the steering means thereof.

FIG. 2 is a block diagram of the receiver-demodulator 35 of the present invention. The multiplexed data output of the OR gate 32, as transmitted by the pulse data transmission means 34, is received at the signal detection and conditioning means 36 of the receiver-demodulator 35. The signal detection and conditioning means 36 is so chosen that, in conjunction with the pulsed data transmission means 34, a data transmission link is constituted. The output of the signal detection and conditioning means 36 is a train of pulse position modulated (time division multiplexed) data duplicating the output of the OR gate 32. The emergent data is simultaneously applied to the gate 42 of a first synchronizer 38 and to the gate 44 of a second synchronizer 40. The gates 42, 44 are strobed alternately (due to an inverter 46 interspersed therebetween) to allow the reciprocate input of the data to the two synchronizers. The passage of alternate segments of time division multiplexed data as synchronized by the time delayed output from the voltage controlled oscillator 54 of the first synchronizer 38, discussed infra, "de-multiplexes" the data so that the pulse position modulated data bits of only one speaker appear in each synchronizer.

The "de-multiplexing" of the transmitted data in the two synchronizers occurs as follows: The free running pulse repetition frequency of the voltage controlled oscillator 54 of the first synchronizer 38 is chosen as one-half that of the master oscillator 26. The output of the voltage controlled oscillator 54 is fed into the delay 56 which delays the leading edge of the pulse for a period of time which is equal to $d + \frac{1}{2}t$, the distance from the mid-point of an "A" or "B" sampling period to the start of the next sampling period. (Note that $t + d$ is the period of the master oscillator 26.) The leading edge of the (delayed) pulse of the voltage controlled oscillator 54 turns on the gate 42. The "on" time of the gate 42 is chosen so that the gate 42 is activated for an entire speaker sampling period. As shown in FIGS. 3(b) and 3(c), the zero voltage amplitude crossover points will activate the comparator 18 and the comparator 24 when no modulation is present in the system. The resulting pulse position signifies the mid-height of a ramp and the mid-point of a ramping period t. (The synchronization of the output of the voltage controlled oscillator 54 to the mid-point of a ramping period is discussed infra.) It can be seen from FIG. 3(d) that, by starting (triggering) with the leading edge of such an unmodulated pulse (shown in dashed lines) and delaying $d+\frac{1}{2}t$, one skips the sampling period for the alternate speaker's pulse position modulated data. To ensure that the gate 42 remains on for all possible locations of the speaker being sampled in the first synchronizer 38, the strobe pulse width extends to the end of the speaker's sampling ramp. Taking the mid-point of the prior sampling period (unmodulated carrier) as the starting point, the pulse must remain on until $t+d+\frac{1}{2}t$ or $3/2\ t+d$. Since the starting point of such pulse has been chosen as $d+\frac{1}{2}t$, the on time of the gate 42 is t. It can be verified from the foregoing that, in the absence of modulation, a system with a time delay 56 of $d+\frac{1}{2}t$ and a gate 42 and a gate 44 having on time t, one synchronizer will be synchronized with the sampling ramp of the ramp generator 28 (signal "A") and the other synchronizer will be synchronized with the sampling ramp of the ramp generator 30 (signal "B") when the voltage controlled oscillator 54 is synchronized to an edge of the master oscillator 26 carrier pulse train.

The output of the gate 42 is applied to the phase-locked loop 48 of the first synchronizer 38. As discussed supra, the output of the voltage controlled oscillator 54 of the phase-locked loop 48 is utilized in conjunction with the time delay 56 to "de-multiplex" the data stream applied to the gate 42 and to the gate 44. The error signal emergent from the phase comparator 58 of the phase-locked loop 48 is applied to the loop filter 62. The loop filter 62, a low-pass filter, is designed to have a high frequency cutoff considerably below the modulation frequency.

The phase-locked loop 50 of the second synchronizer 40 is similarly configured. That is, the output of the phase comparator 64 is applied to a loop low-pass filter 66 whose high frequency cutoff is below that of the lowest modulation frequency. The voltage controlled oscillator 70 of the phase-locked loop 50 operates at a free running pulse repetition frequency of one-half that of the multiplexed transmission as does the voltage controlled oscillator 54 of the phase-locked loop 48.

The output waveform 58a of the phase comparator 58 of the phase-locked loop 48 may be seen in FIG. 3(e). Similarly, the output waveform 64a of the phase comparator 64 of the phase-locked loop 50 may be seen in FIG. 3(f). (It is implicitly assumed that signal "A" is being processed in the first synchronizer 38 and that signal "B" is being processed in the second synchronizer 40. Such an assumption is made merely for the purpose of illustrating the operation of the present invention and it is critical for an appreciation thereof that a reversal of the signals in the two synchronizers such as that occasioned by a temporary interruption along the transmission link may take place without affecting the operation of the present invention.)

The wave shapes of FIGS. 3(e) and 3(f) are characterized by an average dc level equal to approximately one half the supply voltage, with maximum (supply voltage) and minimum (zero voltage) amplitude pulses of varying widths. The width of any given pulse equals the displacement of the leading edge of the modulated pulse 32a being sampled from the position of the leading edge of a (pure) carrier pulse 32b of the same time frame. This is seen to equal the distance between the leading edges of the modulated pulses and the corresponding dashed line of FIG. 3(d). The value (either the supply voltage or zero volts) of the pulse will depend upon the position of the modulated pulse relative to the unmodulated carrier. That is, when the modulated pulse leads the unmodulated carrier pulse, the pulse amplitude is equal to the VCO supply voltage and when it lags the carrier its amplitude is zero volts.

In operation, the phase-locked loop 48 and the phase-locked loop 50 interact with the components external thereto to demodulate the pulse position modulated voice data within the first synchronizer 38 and the second synchronizer 40 and to provide the control signals to the D-type flip-flop 52 which serves as a correlator and directs a steering network, discussed infra. Prior to the transmission of any data, the output of the phase comparator 58 is a steady dc level (theoretically, a zero voltage level would suffice) which, for purposes of illustration, is chosen to be about $2\frac{1}{2}$ volts. The output of the voltage controlled oscillator 54 is applied to the time delay 56. The leading edges of the pulse from the voltage controlled oscillator 54, delayed by $d+\frac{1}{2}t$, serve to turn on the gate 42 for a period of time t. Until such time as voice data (modulation) is received, the output of the signal detection and conditioning means 36 is a pulse train (previously identified in FIG. 3(d) as the pulses 32b) wherein the leading edge of each pulse coincides with the middle of a sampling period (only the pulse positioned carrier is being transmitted). The pulses of this train, having a pulse repetition frequency of twice that of the voltage controlled oscillator 54 and twice that of the voltage controlled oscillator 70, will be admitted alternately to the first synchronizer 38 and to the second synchronizer 40 by the gate 42 and the gate 44, each of which is "on" for the duration of a sampling period.

The free running pulse repetition frequency of each of the voltage controlled oscillators is one-half that of the input pulse train. As the gate "on" times alternate and are each equal to the ramp sampling periods, alternate pulses 32b, each positioned at a (zero voltage) ramp crossover point and each corresponding to the sampling period of only one of the speakers will enter the phase comparator 58 and the phase comparator 64 alternately. Synchronization of the voltage controlled oscillator 54 to the incoming carrier pulses of the first synchronizer 38 (similarly for the incoming alternate pulses of the second synchronizer 40) is achieved as follows: The voltage controlled oscillator 54 operates (free running) at approximately the same pulse repetition frequency as that of the incoming carrier pulses entering the phase-locked loop 48 through the gate 42. If a relative lag or lead in phase should arise between the output of the voltage controlled oscillator 54 and the carrier pulse train, the average voltage level of the output (that is, error signal) of the phase comparator 58 integrated by the loop filter 62 to provide the phase-error voltage input to the voltage controlled oscillator will vary. As is well known in the communication art, the polarity of the resultant phase-error voltage is such that it will pull the oscillator frequency in a direction to phase-track the reference frequency. Thus, the voltage controlled oscillator 54 will track and lock onto the incoming alternate carrier pulses corresponding either to signal "A" or signal "B" in terms of frequency and phase. (Of course, as in the case of any conventional phase-locked loop, a finite phase difference will exist between the output of the voltage controlled oscillator 54 and the incoming pulse train. This net phase difference is required for generating the corrective error voltage output of the phase comparator 58. However, for the purpose of this discussion, it need only be recognized that the phase-locked loops of the invention are conventional apparatus by means of which the voltage controlled oscillator 54 and the voltage controlled oscillator 70 are automatically synchronized to trains of alternating carrier pulses, one train representing the carrier to be modulated by the data of signal "A" and the other the carrier to be modulated by the data of signal "B".)

There are shown in FIGS. 3(e) and 3(f) the outputs of the phase comparator 58 and the phase comparator 64 resulting from the input of the modulated pulses of FIG. 3(d). The output of each phase comparator is a three level pulse train having a steady dc level equal to about one-half the voltage controlled oscillator supply voltage, pulsed up to the supply voltage when the modulated pulse's leading edge lags the leading edge of the carrier (as supplied by the voltage controlled oscillator) and which is pulsed down to zero voltage when the leading edge of the modulated pulse leads the carrier. The width of either amplitude pulse is equal to the amount by which the pulse leads or lags the carrier. The output of the phase comparator 58 as shown in FIG. 3(e) thus represents the amount by which the modulated signal in the first synchronizer 38 is displaced in position from the position of its carrier. In effect, since the voice is pulse position modulated, the output of the phase comparator 58 represents a partial demodulation of the incoming data. Within the phase-locked loops of the synchronizers, the phase comparator outputs are applied to conventional low-pass filters (shown as the loop filters 62,66) which integrate the phase comparator outputs and apply the resultant d.c. level as the voltage controlled oscillator input. The filters are designed for a high frequency cutoff below the modulation frequency. With the voltage controlled oscillator(s) synchronized to the master oscillator 26, the modulation is pure ac, therefore the total pulse volt-time area of phase comparator outputs pulsed to the supply voltage level will equal the total volt-time area of those pulsed down to zero volts. Thus, in theory, the average voltage controlled oscillator voltage should remain at its established dc level, maintaining the VCO frequency at one-half the carrier frequency or, alternatively stated, at the carrier of the information to which it is synchronized. This average voltage level is maintained by means of the relatively low high frequency cutoff of the loop (low-pass) filter 62. The low cutoff value assures that the established VCO output will not be perturbed by the pulses induced by the modulation of the incoming data but will drift to a new equilibrium if the frequency of the master oscillator 26 should change. Thus the voltage controlled oscillator 54 is maintained at the frequency and phase of the carrier of the incoming modulation and the incoming voice continues to be partially demodulated by means of the phase comparator 58. This process will continue regardless of whether the audio of signal "A" or the audio of signal "B" is being processed within the first synchronizer 38 (or the second synchronizer 40) and despite the fact that an interruption of transmission may reverse the signal synchronizer ordering.

The above-described process by which the voltage controlled oscillator 54 is synchronized in both frequency and phase to the received carrier pulse train of the first synchronizer 38 is similarly accomplished in the second synchronizer 40 to synchronize the voltage controlled oscillator 70 of the phase-locked loop 50 to the phase and frequency of the received carrier pulse train of the second synchronizer 40. Due to the fact that the voltage controlled oscillator 54 and the voltage controlled oscillator 70 are synchronized in frequency and phase to alternate pulses, the leading edges (and, for that matter, the trailing edges) of the output of the voltage controlled oscillator 54 will differ in phase by a constant amount from those of the voltage controlled oscillator 70. Additionally, due to the asymmetricity of the pulses of the master oscillator 26, the average interpulse spacing of pulses of the two-carrier multiplexed pulse train alternates between two different values. That is, the zero voltage (unmodulated carrier) crossover point of the signal "A" as shown in FIG. 3(b) leads that of the signal "B" as shown in FIG. 3(c) by the pulse width t of the asymmetric carrier. However, the zero crossover point of the signal "B" leads that of the next signal "A" carrier pulse by the interpulse spacing d, an amount greater than t.

The output of the voltage controlled oscillator 54 of the first synchronizer 38 is applied to the data port of a D-type flip-flop 52 and the output of the voltage controlled oscillator 70 of the second synchronizer 40 is applied as the clock input. The duration of each voltage controlled oscillator's output pulses is a value intermediate the pulse width t and the interpulse spacing d. The D-type flip-flop 52 is thereby enabled to identify the data by its synchronizer as follows: When (as long as) the data of signal "A" is being processed in the first synchronizer 38 (and hence the voltage controlled oscillator 54 of the phase-locked loop 48 is locked onto the signal "A" carrier pulses) and that of signal "B" is processed in the second synchronizer 40 (the voltage controlled oscillator 70 of the phase-locked loop 50 locked onto the channel "B" carrier pulses) the output of the D-type flip-flop 52 is high. This is due to the fact that the leading edges of the output pulses from the voltage controlled oscillator 54, synchronized to the carrier of signal "A", lead the corresponding edges of the pulses of the voltage controlled oscillator 70 by the pulse width t of the asymmetric master oscillator 26. As the widths of these pulses are somewhat greater than their spacings t, the arrival of the clocking pulse from the voltage controlled oscillator 70 at the flip-flop 52 will occur when the data input (output of the voltage controlled oscillator 54) of the flip-flop 52 is high. According to conventional D-type flip-flop logic, the state of the Q output of the flip-flop 52 reflects that of the data input when clocked and the state is maintained until the next clock pulse arrives. If speech data from signal "A" remains in the first synchronizer 38 while that from signal "B" remains in the second synchronizer 40, each arrival of a clock pulse at the flip-flop 52 will concur with the high state of data at the input to the flip-flop 52. Thus, the output of the flip-flop 52 will remain high as long as this ordering of data within the synchronizers exists. Similarly, when the voice data of signal "B" is being processed in the first synchronizer 38 and that of signal "A" in the second synchronizer 40, the voltage controlled oscillator 54 is synchronized to the carrier of the channel "B" pulses and the voltage controlled oscillator 70 is synchronized to the carrier of the signal "A" pulses. In this case, the (leading edges of) pulses of the voltage controlled oscillator 54 will lead those of the voltage controlled oscillator 70 by the asymmetric master oscillator 26 interpulse spacing d. Since, as stated above, the VCO pulse width is somewhat less than d, the arrival of the leading edge of a clocking pulse from the voltage controlled oscillator 70 at the flip-flop 52 will occur after the output from the voltage controlled oscillator 54 (data input to the flip-flop 52) has pulsed and returned to its low state. Thus, the output of the flip-flop 52 goes low when the voice of the signal "B" is processed in the first synchronizer 38 and the voice of the signal "A" is processed in the second synchronizer 40. Because the voltage controlled oscillators operate at identical frequencies, their pulse relationships are maintained for the duration of a given (signal "A", signal "B") ordering of signals and thus the output of the flip-flop 52 remains either high or low dependent upon that ordering.

The conversations having been identified by the flip-flop 52, a steering network is employed to assure that the proper voice data is directed to the proper listening stations. The steering network comprises the four digitally-controlled analog switches 76, 78, 80 and 82. The outputs of the switches 76, 80 are applied to the audio amplifier 72 through the conventional interpolating audio filter 60 and those of the switches 78, 82 are applied to the audio amplifier 74 through a conventional interpolating audio filter 68. The switches 76,78 are controlled by the Q output of the flip-flop 52 whereas the switches 80, 82 are controlled by its $\overline{Q}$ output. The "direct" switches 76, 78 are open when Q is low and close when Q goes high. The "redirect" switches 80, 82 operate in the same manner, remaining open when $\overline{Q}$ is low and closed when $\overline{Q}$ is high. The steering network assures that the "A" signal is heard only by means of the audio amplifier 72 and the "B" signal is heard only by the audio amplifier 74.

As the output of the flip-flop 52 goes high when the "A" signal is being processed in the first synchronizer 38, the switch 76 will then connect the data of signal "A" to the audio amplifier 72 through the audio filter 60. Similarly, the switch 78 closes to connect the signal "B" data of the second synchronizer 40 to the audio amplifier 74 through the audio filter 68. No signal is redirected to either audio amplifier through the open switch 80 or switch 82, as $\overline{Q}$ is low when signal "A" is in the first synchronizer 38 and signal "B" is in the second synchronizer 40.

If the data stream should be interrupted along the transmission link and the ordering of the two signals by synchronizer reverse within the receiver, the output of the flip-flop 52 will reverse. In this instance, neither the switch 76 nor the switch 78 will pass the outputs of the synchronizers. The $\overline{Q}$ output of the flip-flop 52, now high, closes the switch 80 to pass the data of signal "A" in the second synchronizer 40 to the signal "A" audio amplifier 72 through the audio filter 60. Similarly the high $\overline{Q}$ output of the flip-flop 52 closes the switch 82 to pass signal "B" data from the first synchronizer 38 to the audio amplifier 74 through the audio filter 68.

From the foregoing, it is seen that there has been brought to the art of pulsed communications a system to modulate, demodulate, and maintain separate, multiple independent channels of information to achieve the secure transmission of independent data over a single link.

By means of a system incorporating the invention, two or more independent signals may be multiplexed and transmitted over a single transmission link without the addition of data bits into the message for purposes of signal identification. The automatic ordering data at the receiver thus minimizes the system power and bandwidth requirements. Variations including obvious extensions of the invention as disclosed to greater than two-signal systems may be achieved and any and all such variations are contemplated and intended to be included within its scope.

What is claimed is:

1. In a system for transmitting two independent signals consisting of first and second signals over a single communication link, the combination of:
    (a) first input means to accept the first signal and second input means to accept the second signal;
    (b) modulation means for transforming said signals into a single time division multiplexed stream of pulse position modulated data bits wherein alternate pulses correspond to said first and second signals said multiplexed stream being characterized by an asymmetric average interpulse spacing;
    (c) transmission means for converting said stream of data bits to a corresponding data transmission;
    (d) receiver means for accepting said data transmission which is to be demultiplexed into said first and second signals;
    (e) a first synchronizer having an input and an output, said first synchronizer including a first phase-locked loop having a voltage controlled oscillator whose free running pulse repetition frequency is one-half the frequency of said time division multiplexed stream of pulse position modulated data bits;
    (f) a second synchronizer having an input and an output, said second synchronizer including a second phase-locked loop having a voltage controlled oscillator whose free running pulse repetition frequency is one-half that of said time division multiplexed stream of pulse position modulated data bits;
    (g) gating means for applying alternate pulses of said multiplexed stream of pulse position modulated data bits to the input of said first synchronizer and to the input of said second synchronizer;
    (h) first output means for receiving said demultiplexed first signal;
    (i) second output means for receiving said demultiplexed second signal; and
    (j) steering means connected to the output of said first synchronizer and said second synchronizer, said steering means responsive to said asymmetric average interpulse spacing for directing said first signal to said first output means and said second signal to said second output means so that said first signal is applied to said first output means and said second signal is applied to said second output means regardless of the synchronizer ordering of said signals.

2. A system as defined in claim 1 additionally characterized in that said first synchronizer includes:
    (a) delay means for accepting the pulse train output of the voltage controlled oscillator of said first phase-locked loop and reproducing at its output said pulse train delayed in time by the larger of said asymmetric interpulse spacings plus one-half of the smaller of said interpulse spacings;

(b) a first gate and a second gate, said first gate having an "on" time substantially equal to the lesser of said interpulse spacings and said second gate having an "on" time substantially equal to the lesser of said interpulse spacings, the pulse train output of said delay means being applied to the first gate to turn said gate "on"; and (c) an inverter interposed between the output of said delay means and said second gate so that said second gate is turned "on" by the pulse output of said inverter;

(d) said system being also characterized further in that (1) said time division multiplexed stream of pulse position modulated data bits is applied to said first gate and to said second gate, (2) said voltage controlled oscillator of said first synchronizer is locked onto the average (carrier) position of the pulses of said time division multiplexed stream of pulse position modulated data bits of one of said independent signals, and (3) the voltage controlled oscillator of said second synchronizer is locked onto the average (carrier) position of the pulses of said time division multiplexed stream of pulse position modulated data bits of the other independent signal.

3. A system as defined in claim 2 further characterized in that:

(a) the high frequency cutoff of the loop filter of said phase-locked loop of said first synchronizer and that of the loop filter of said phase-locked loop of said second synchronizer is below the lowest modulation frequency; and (b) the output of each said loop filter is applied to the voltage controlled oscillator of its respective phase-locked loop so that the pulse repetition frequency and phase of the pulse train output of each of said voltage controlled oscillators is a function of the carrier pulse repetition frequency of the multiplexed stream of pulse position modulated data bits.

4. A system as defined in claim 3 further characterized in that:

(a) said steering means includes a D-type flip-flop;

(b) the pulse train outputs of each of said voltage controlled oscillators are characterized by a pulse duration intermediate the lengths of the smaller and the larger of said interpulse spacings;

(c) the output of said voltage controlled oscillator of said phase-locked loop of said first synchronizer is applied to the data input of said D-type flip-flop; and (d) the output of said voltage controlled oscillator of said phase-locked loop of said second synchronizer is applied as the clock input of said D-type flip-flop wherein the output of said flip-flop goes high when one ordering of said independent signal is being processed in said synchronizers and said output goes low when the opposite ordering of said independent signals is being processed in said synchronizers.

5. A system as defined in claim 4 wherein said steering means additionally comprises:

(a) a first analog switch controlled by the Q output of said flip-flop to accept the output of said first synchronizer and connect said synchronizer to said first output means;

(b) a second analog switch controlled by the $\overline{Q}$ output of said flip-flop to accept the output of said second synchronizer and connect said synchronizer to said first output means;

(c) a third analog switch controlled by the Q output of said flip-flop to accept the output of said second synchronizer and connect said synchronizer to said second output means; and (d) a fourth analog switch controlled by the $\overline{Q}$ output of said flip-flop to accept the output of said first synchronizer and connect said synchronizer to said second output means.

6. A system as defined in claim 5 wherein said modulation means includes an asymmetric master oscillator to transform said data into a time division multiplexed stream of pulse position modulated data bits having an asymmetric average interpulse spacing.

7. In a system for receiving a data transmission of time division multiplexed stream of pulse position modulated data bits characterized by an asymmetric average interpulse spacing wherein said transmission represents the modulated data of two independent signals consisting of first and second signals, the combination of:

(a) receiver means for accepting said data transmission;

(b) a first synchronizer having an input and an output said first synchronizer including a first phase-locked loop having a voltage controlled oscillator whose free running pulse repetition frequency is one-half the frequency of said time division multiplexed stream of pulse position modulated data bits;

(c) a second synchronizer having an input and an output, said second synchronizer including a second phase-locked loop having a voltage controlled oscillator whose free running pulse repetition frequency is one-half that of said time division multiplexed stream of pulse position modulated data bits;

(d) gating means for applying alternate pulses of said stream of digital data bits to the input of said first synchronizer and to the input of said second synchronizer;

(e) first output means for receiving said first signal;

(f) second output means for receiving said second signal; and (g) steering means connected to the output of said first synchronizer and second synchronizer, said steering means responsive to said asymmetric average interpulse spacing for directing said first signal to said first output means and said second signal to said second output means so that said first signal is applied to said first output means and said second signal is applied to said second output means regardless of the synchronizer ordering of said signals.

8. A system as defined in claim 7 additionally characterized in that said first synchronizer includes:

(a) delay means for accepting the pulse train output of the voltage controlled oscillator of said first phase-locked loop and reproducing at its output said pulse train delayed in time by the larger of said asymmetric interpulse spacings plus one-half of the smaller of said interpulse spacings;

(b) a first gate and a second gate, said first gate having an "on" time substantially equal to the lesser of said interpulse spacings and said second gate having an "on" time substantially equal to the lesser of said interpulse spacings, the pulse train output of said delay means being applied to the first gate to turn said gate "on"; and (c) an inverter interposed between the output of said delay means and said second gate so that said second gate is turned "on" by the pulse output of said inverter;

(d) said system being also characterized further in that (1) said time division multiplexed stream of pulse position modulated data bits is applied to said first gate and to said second gate, (2) said voltage controlled oscillator of said first synchronizer is locked onto the average (carrier) position of the pulses of said time division multiplexed stream of pulse position modulated data bits of one of said independent signals, and (3) the voltage controlled oscillator of said second synchronizer is locked onto the average (carrier) position of the pulses of said time division multiplexed stream of pulse position modulated data bits of the other independent signal.

9. A system as defined in claim 8 further characterized in that:

(a) the high frequency cutoff of the loop filter of said phase-locked loop of said first synchronizer and that of the loop filter of said phase-locked loop of said second synchronizer is below the lowest modulation frequency; and (b) the output of each said loop filter is applied to the voltage controlled oscillator of its respective phase-locked loop so that the pulse repetition frequency and phase of the pulse train output of each of said voltage controlled oscillators is a function of the carrier pulse repetition frequency of the multiplexed stream of pulse position modulated data bits.

10. A system as defined in claim 9 further characterized in that:

(a) said steering means includes a D-type flip-flop;

(b) the pulse train output of each of said voltage controlled oscillators is characterized by a pulse duration intermediate the length of the smaller and the larger of said interpulse spacings;

(c) the output of said voltage controlled oscillator of said phase-locked loop of said first synchronizer is applied to the data input of said D-type flip-flop; and (d) the output of said voltage controlled oscillator of said phase-locked loop of said second synchronizer is applied as the clock input of said D-type flip-flop wherein the output of said flip-flop goes high when one ordering of said independent signals is being processed in said synchronizers and said output goes low when the opposite ordering of said independent signals is being processed in said synchronizers.

11. A system as defined in claim 10 wherein said steering means additionally comprises:

(a) a first analog switch controlled by the Q output of said flip-flop to accept the output of said first synchronizer and connect said synchronizer to said first output means;

(b) a second analog switch controlled by the $\overline{Q}$ output of said flip-flop to accept the output of said second synchronizer and connect said synchronizer to said first output means;

(c) a third analog switch controlled by the Q output of said flip-flop to accept the output of said second synchronizer and connect said synchronizer to said second output means; and (d) a fourth analog switch controlled by the $\overline{Q}$ output of said flip-flop to accept the output of said first synchronizer and connect said synchronizer to said second output means.

12. A method for transmitting two independent signals consisting of first and second signals over a single communication link comprising the steps of:

(a) transforming said signals into a single time division multiplexed stream of pulse position modulated data bits wherein the positions of the alternate pulses correspond to the information of said first and second signals, said multiplexed stream being characterized by an asymmetric average interpulse spacing;

(b) transmitting said data;

(c) receiving said data transmission;

(d) applying alternate pulses of said multiplexed stream of pulse position modulated digital data bits to a first synchronizer and to a second synchronizer, said first synchronizer including a first phase-locked loop having a voltage controlled oscillator whose free running pulse repetition frequency is one-half the frequency of said time division multiplexed stream of pulse position modulated dated bits and said second synchronizer including a second phase-locked loop having a voltage controlled oscillator whose free running frequency is one-half that of said time division multiplexed stream of pulse position modulated data bits;

(e) identifying the signals being processed with said synchronizers according to the average position of the pulses in said first synchronizer relative to those of said second synchronizer; and (f) directing said first signal to a first preselected output means and said second signal to a second preselected output means so that said first signal is applied to said first output means and said second signal is applied to said second output means regardless of the synchronizer ordering of said signals.

* * * * *